US009659114B2

(12) United States Patent
He et al.

(10) Patent No.: US 9,659,114 B2
(45) Date of Patent: May 23, 2017

(54) REAL TIME DYNAMIC PHYSICS SIMULATION DEVICE OF FLEXIBLE DC TRANSMISSION SYSTEM

(75) Inventors: Zhiyuan He, Beijing (CN); Dong Liu, Beijing (CN); Yan Zhao, Beijing (CN); Yuefeng Yang, Beijing (CN); Renqiu Wang, Beijing (CN)

(73) Assignees: STATE GRID CORPORATION OF CHINA, Beijing (CN); CHINA ELECTRIC POWER RESEARCH INSTITUTE, Beijing (CN)

( * ) Notice: Subject to any disclaimer, the term of this patent is extended or adjusted under 35 U.S.C. 154(b) by 795 days.

(21) Appl. No.: 14/129,056

(22) PCT Filed: Nov. 29, 2011

(86) PCT No.: PCT/CN2011/083126
§ 371 (c)(1),
(2), (4) Date: Dec. 24, 2013

(87) PCT Pub. No.: WO2012/174827
PCT Pub. Date: Dec. 27, 2012

(65) Prior Publication Data
US 2014/0129195 A1 May 8, 2014

(30) Foreign Application Priority Data
Jun. 24, 2011 (CN) .......................... 2011 1 0171890

(51) Int. Cl.
*G06F 17/50* (2006.01)
*G01R 31/28* (2006.01)
*G01R 31/08* (2006.01)

(52) U.S. Cl.
CPC ..... *G06F 17/5009* (2013.01); *G01R 31/2848* (2013.01); *G01R 31/085* (2013.01); *G01R 31/086* (2013.01); *G01R 31/088* (2013.01)

(58) Field of Classification Search
CPC .................................................... G01R 31/086
(Continued)

(56) References Cited

U.S. PATENT DOCUMENTS 4,370,609 A * 1/1983 Wilson ................ G01R 31/021
324/522
5,317,525 A * 5/1994 Taoka ....................... G06J 1/00
703/18
(Continued)

*Primary Examiner* — Hugh Jones
(74) *Attorney, Agent, or Firm* — Platinum Intellectual Property LLP

(57) ABSTRACT

The present invention relates to a real time dynamic physics simulation device of flexible DC transmission system. The device includes simulated converter transformer, simulated AC field, simulated DC field, simulated converter reactor, simulated converter, and measurement and control cabinet chassis; the simulated AC field includes the vacuum switch I, the contactor I, resistors and the vacuum switch II connected orderly; the simulated DC field includes successively connected the vacuum switch contactor III and II; the simulated AC field is connected with said measurement and control cabinet chassis; Said converter transformer is set between said resistors and said vacuum switch II; Said simulated converter reactors and said simulated converter connected are set between the vacuum switch II and the vacuum switch III. The present invention can accurately simulate different voltage level flexible DC transmission system based on modular multilevel converter (MMC-HVDC), able to accurately understand the operation characteristics of MMC-HVDC and the dynamic responds to the instruction of the control system.

9 Claims, 3 Drawing Sheets

(58) Field of Classification Search
USPC .......................................................... 703/18
See application file for complete search history.

(56) References Cited

U.S. PATENT DOCUMENTS 9,264,008 B2* 2/2016 Bergdahl .............. H03H 19/004
2007/0043549 A1* 2/2007 Evans ................. G06F 17/5036
703/18

* cited by examiner

REAL TIME DYNAMIC PHYSICS SIMULATION DEVICE OF FLEXIBLE DC TRANSMISSION SYSTEM

RELATED APPLICATIONS

This application is a United States National Stage Application filed under 35 U.S.C 371 of PCT Patent Application Serial No. PCT/CN2011/083126, filed Nov. 29, 2011, the disclosure of all of which are hereby incorporated by reference in their entirety.

FIELD OF THE INVENTION

The invention relates to DC transmission field, in particular, relates to a real time dynamic physics simulation device of flexible HVDC transmission system.

BACKGROUND OF THE INVENTION

The flexible direct current (DC) transmission is at a new transmission method, which adopts direct current for transmission and uses the turn-off voltage source converters and advanced modulation technology to carry out DC transmission. It has some advantages, like supplying power for isolated grid, without commutation failure, no need for reactive power compensation, being able to control flexibly active and reactive power output etc, and it is also a beneficial supplement for the alternating current (AC) network, to achieve the power delivery and to improve the existing AC transmission capability and stability, so as to make the existing AC transmission system more effective. The modular multilevel converter is composed of multiple sub modules in series, and the sub module is composed of a bypass switch, a thyristor, an IGBT, a diode and a capacitor.

The first state MMC-HVDC project will be in operation in Shanghai Nanhui wind power plant. However, the converter valve level number is less than 15 of the present physical simulation prototype which is designed for the MMC-HVDC engineering, it has large volume and high voltage, and RTDS can only realize off-line test.

Figure 1:
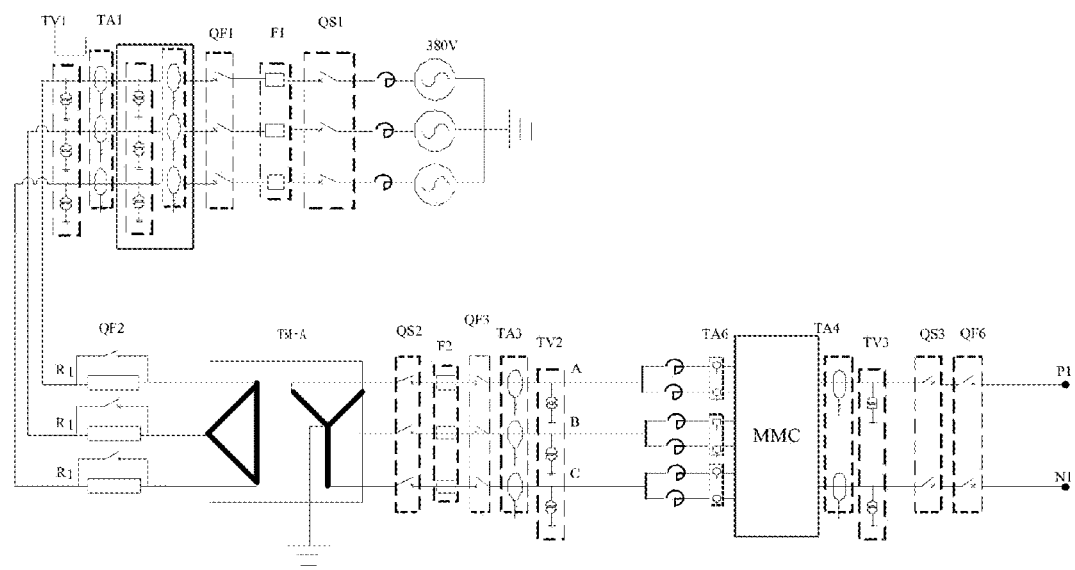
FIG. 1 is a structure schematic diagram and the sensor layout of main circuit of the dynamic simulation test device provided by the invention.

L1 is an adjustable reactor; L2 is the converter; QS1 is the vacuum switch I, QSII is the vacuum switch II, QSIII is the vacuum switch III; QF1 is the contactor I, QF6 is the contactor II; QF2 is the contactor III, QF3 is a contactor; TAx is the Holzer current sensor; TVx is the Holzer voltage sensor; Fx is a fuse; and R1 is resistors.

SUMMARY OF THE INVENTION

The objective of the invention is, in view of the defects existing in the prior art, to provide a dynamic simulation device, which can accurately simulate the 20-100MVA capacity, different voltage levels MMC-HVDC system.

A real time dynamic physics simulation device of flexible DC transmission system provided by the invention is improved that, it includes simulated converter transformer, simulated AC field, simulated DC field, simulated converter reactor, simulated converter, and measurement and control cabinet chassis;

Said simulated AC field includes the vacuum switch I, the contactor I, resistors and the vacuum switch II which are connected orderly; said simulated DC field includes successively connected the vacuum switch contactor III and II: said simulated AC field is connected with said measurement and control cabinet chassis;

Said converter transformer is set between said resistors and said vacuum switch II;

Said simulated converter reactors and said simulated converter set between the vacuum switch II and the vacuum switch III are connected.

The first preferable technical solution provided by the invention, wherein said measurement chassis includes the analog acquisition board, signal conditioning board, the switching quantity input and output plate, central processing board, display and recording equipment; said analog acquisition board gathers the corresponding analog and switch quantities which outputs control signals through the switching quantity output interface to realize the circuit breaker/closing operation of all levels breakers.

The second preferable technical solution provided by the invention, wherein said control cabinet comprises central processing boards, optical fiber communication boards, and a power board; said central processing board comprises DSP, FPGA processor, level conversion circuit and communication channels; said control cabinet is used for connecting test system, and its current and voltage signals will be send to upper layer control system through said communication channels, wherein the upper layer control system is valve based electron controller or control and safe guard system.

The third preferable technical solution provided by the invention, is improved that, said simulate converter is three-phase full bridge form, of which each phase has upper and lower two arms, each arm consists of several scaled down MMC sub module boards in series.

The fourth preferable technical solution provided by the invention, is improved that, said converter transformer is a three-phase YD tapped double windings transformer.

The fifth preferable technical solution provided by the invention, is improved that, said converter reactor is a three-phase low loss and high quality factor dry-type reactor; of which each phase has two reactors with same reactance value, named the upper arm converter reactor and the lower arm converter reactor, respectively; the joints near transformer side of two reactors of each phase are connected with each other, and connect with transformer converter valve through AC field switch. And the other two ends are respectively connected with the phase upper and the lower arm of converter valve.

The sixth preferable technical solution provided by the invention, is improved that, said set contactor III is connected with said resistor in parallel.

The seventh preferable technical solution provided by the invention, is improved that, said converter transformer is non standard transmission ratio transformer, according to the simulated system, the capacity ratio and the transformer ratio are selected, and the equation is:

$$N_s = \frac{S_{prototype}}{S_{demonstration\ project}}$$

$$N_v = \frac{V_{prototype}}{V_{demonstration\ project}}$$

The eighth preferable technical solution provided by the invention, is improved that, said converter reactor design not only is according to the actual engineering but also can limit the transient and fault current overshoot of simulated device, and its current and impedance simulation ratio are:

$$N_I = \frac{N_S}{N_V}$$

$$N_Z = \frac{N_V}{N_I}$$

Compared with the prior art, the present invention has the following advantages:

The present invention can accurately simulate 20-100MVA capacity, different voltage level flexible DC transmission system based on modular multilevel converter (MMC-HVDC), and can capable of responding to accurately understand the operation characteristics of MMC-HVDC and the dynamic responds to the instruction of the control system.

The converter of the invention adopts modular design so that it has compact structure, and convenient radiating and debugging.

The bridge arm of the invention adopts the negative resistor series compensation so that it can greatly reduce the percentage of the low voltage device impedance in the working voltage, it is close to the actual engineering.

The sub module controller of the invention does not need a high power supply circuit, but adopting low-voltage power supply mode. That makes the capacitor energy not be consumed excessively in the controller; it is close to the actual engineering.

DETAILED DESCRIPTION OF EMBODIMENTS

The detail of the embodiments is described as below incorporated with the figures by way of cross-reference for the present invention.

Embodiment 1:

FIG. 1 is the structure schematic diagram and the sensor layout of main circuit of the embodiment. It includes simulated converter transformer, simulated AC field, simulated DC field, simulated converter reactor, simulated converter, and measurement and control cabinet chassis. The simulated AC field includes the vacuum switch I, the contactor I, resistors and the vacuum switch II which are connected orderly. The simulated DC field includes successively connected the vacuum switch contactor III and II. The simulated AC field is connected with measurement and control cabinet chassis. The converter transformer is set between resistors and the vacuum switch II. The simulated converter reactors connected and the simulated converter are set between the vacuum switch II and the vacuum switch III, and the contactor III and resistors are connected in parallel and set between the vacuum switch II and the vacuum switch III. In the embodiment, the resistors and adjustable reactor are used to simulate engineering DC line.

The converter transformer is a three-phase YD tapped double windings transformer, non standard transmission ratio. The primary voltage of converter transformer is 220~600V, and the secondary voltage varies from 90V to 300V according to the tap. According to the simulated system, the capacity ratio and the transformer ratio are different and both ratio values choose are independent relatively for each other:

$$N_s = \frac{S_{prototype}}{S_{demonstration\ project}}$$

$$N_v = \frac{V_{prototype}}{V_{demonstration\ project}}$$

The converter reactor is a three-phase low loss and high quality factor dry-type reactor, of which each phase has two reactors with same reactance value, named the upper arm converter reactor and the lower arm converter reactor, respectively. The joints near transformer side of two reactors of each phase are connected with each other, and connect with transformer converter valve through AC field switch. And the other two ends are respectively connected with the phase upper and the lower arm of converter valve. Not only the converter reactor is designed according to the actual engineering but also can limit the transient and fault current overshoot of simulated device, and its current and impedance simulation ratio are:

$$N_I = \frac{N_S}{N_V}$$

$$N_Z = \frac{N_V}{N_I}$$

The contactor is a low voltage AC contactor. It is an important protection switch, but also a input and output device among different sub systems. The simulated contactor can receive the instruction from control and protection system, and the states are acquired by the measurement cabinet chassis.

MMC converter is three-phase full bridge form, of which each phase has upper and lower two arms, each arm consists of several scaled down MMC sub module boards in series. In operation, the electronic controller of arm sub module receives commands from upper control system by optical fiber to carry out the cast/cut control for the capacitance of the sub module, and can get 100V-600V modulation sine ladder wave at the converter AC outlet. Each arm of the converter comprises 30-100 sub modules. Each sub module is composed of the main circuit and electronic controllers two parts. The electronic controller is composed of digital controller, driving circuit, sub module voltage sampling circuit, communication interface, power supply module and so on. The main circuit structure is as follows: 1) a MOS pipe, two diodes is anti paralleled to form a module, two same modules series and forms a MOS pipe, and upper emitter is connection with lower collector; 2) an electrolytic capacitors, of which positive terminal is connected with upper collector, and the negative is connected with lower emitter; 3) a equalizing resistor paralleled with the capacitor, when the capacitor is put into arm, the resistor is used to balance module voltage; 4) a bypass relay and a thyristor. And 1-2 converter arms are arranged in one cabinet, of which each arms is comprised of 2-5 chastises, the chassis whose size is standard size can accommodate 5-30 sub modules and controllers. The sub modules are integrated in the chassis, the main circuit is realized by the chassis backplane bus, the measurement points are extracted from the backplane. Because the sub module of the simulated device has a low working voltage, so that the valve is in the relatively low potential, and the controller of the sub module does not need a high power supply circuit, but adopts the low-voltage transmission mode. And the power supply circuit is also completed through the chassis backplane.

The measurement chassis includes the analog acquisition board, signal conditioning board, the switching quantity input and output plate, central processing board, display and recording equipment. This part is used to gather the analog and switch quantities. It outputs control signals through the switching quantity output interface to realize the circuit breaker/closing operation of all levels breakers. The current acquisition of said dynamic simulation equipment is get through current sensor and signal acquisition board. It is used to acquires and codes the signals of primary/secondary current, six arms current and positive and negative DC bus current, respectively, which is characterized that the current control signal and protection current signal acquisition channels are separated, their sensor range and accuracy different. And the voltage acquisition is similar to that.

The control cabinet comprises 2 central processing boards (mutual spinning reserve, mainly composed of DSP, FPGA processor, level conversion circuit and communication channels etc), 2 optical fiber communication boards, and a power board.

The measurement and control cabinet chassis is characterized that: 1) when the simulation device does not test PCP, it which is as a station control system of simulation device will carry out the control algorithm and strategy; 2) when used for the VBC and PCP verification in the actual project, the control cabinet is used for treating the analog and switch quantity.

Figure 2:
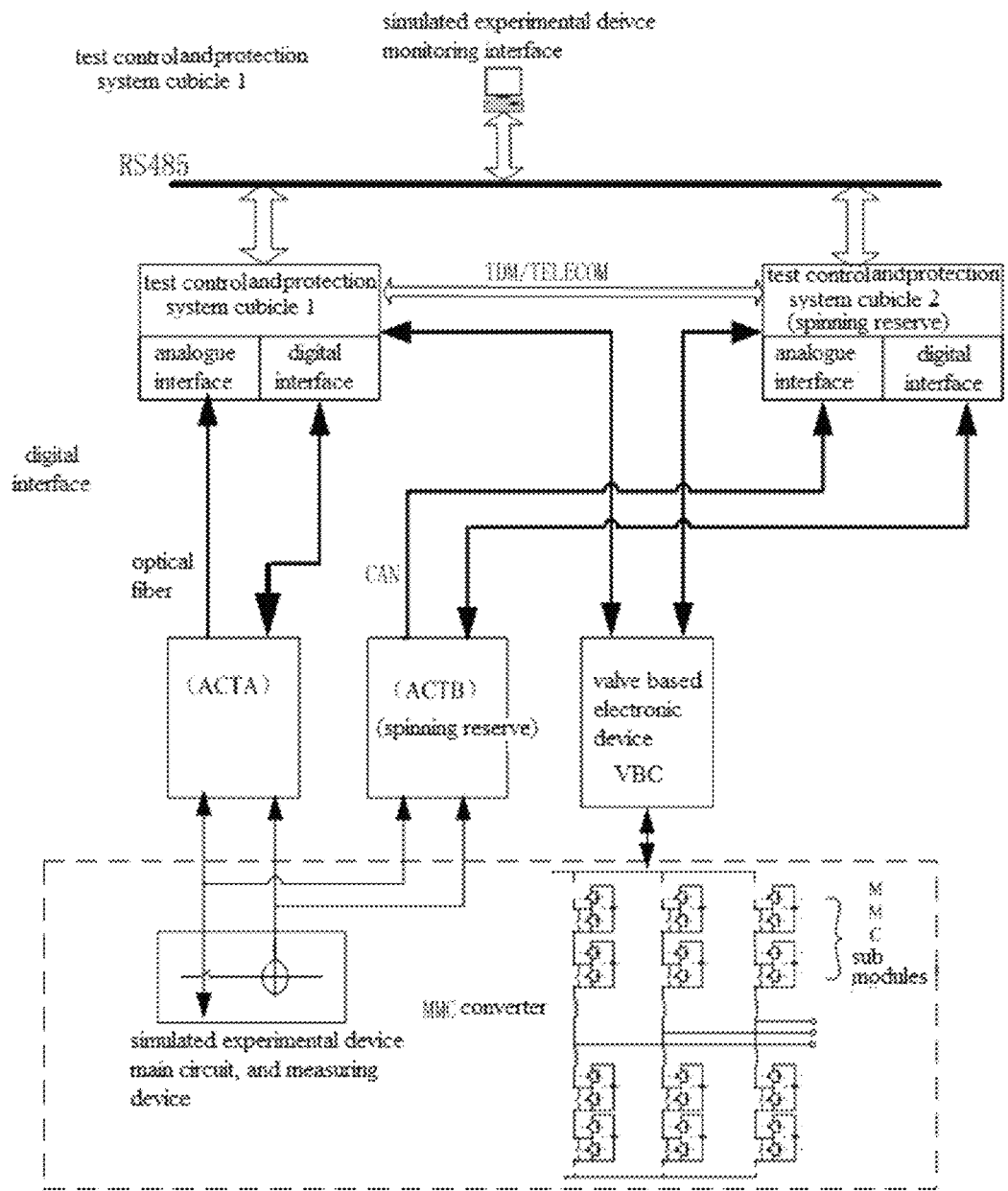
FIG. 2 is a wiring layout of main circuit of the dynamic simulation test device and the control system PCP and valve base electronic controller (VBC) test provided by the invention.

The dynamic simulation device parameters are designed according to above Shanghai Nanhui wind power plant 20MW flexible HVDC transmission system, and the connection is showed in FIG. 2.

The dynamic simulation device is in FIG. 2 dashed box, and the rest part comprises the valve based electronic controller VBC and the program control and protection system PCP. The dynamic simulation device is respectively connected with the two measured AC terminal cubicle ACTA and ACTB, and then connecting with are respectively the program control and protection system through ACTA and ACTB. The optical fiber between the dynamic simulation device and the VBC/PCP is used for communicate and isolate high and low potential, its speed is same to practical engineering.

When simulating 20MVA system, turn the converter transformer primary voltage to 250V by the pressure regulator, and secondary voltage varies from 120V to 300V according different taps. The capacity ratio and the transformer voltage ratio are selected according to following formulas:

$$N_s = \frac{S_{prototype}}{S_{demonstration\ project}} = 5.2 * 10^{-5}$$

$$N_v = \frac{V_{prototype}}{V_{demonstration\ project}} = 7.25 * 10^{-3}$$

After the capacity ratio and the voltage ratio being determined, choose current and impedance simulation ratio according to the following method:

$$N_I = \frac{N_S}{N_V} = 7.17 * 10^{-3}$$

$$N_Z = \frac{N_V}{N_I} = 1.021$$

According to the AC system equal impedance, the reactance into the test room power supply circuit is determined.

Each bridge arm of MMC converter used in device comprises 30-100 sub modules, and its number is adjustable. The information needs to interface between VBC and sub module includes: receiving sub module action commands sent by VBC and uploading itself fault information and working state information.

The communication protocol between VBC and the bridge arm sub modules are as follows: 1) physical layer. Optical fiber used is 62.5/120 um multimode fiber, transmitter used is HFBR-141, and receiver used is HFBR-2416. a full duplex channel is constituted through two optical fiber lines 2) Link layer. Adopting asynchronous serial communication, coding method adopts unipolar non return to zero code. The frame format is:

| Start of frame | Data field | Parity bit | End of frame |
| --- | --- | --- | --- |

Start of frame--bit logic 1; parity bit-odd parity (no retransmission mechanism); end of frame-bit logic 1.

The AC, DC field breaker of simulated HVDC transmission system adopts 100V DC power supply, and its action time is 30-50 ms. And the system adopts 5 A vacuum switch to disconnect and simulate the short circuit fault. It also has over current protection function.

Using adjustable resistor and reactor to simulate engineering DC line, using 0.21 mH inductor to simulate 0.77 mH per unit length of 30 kV DC transmission line, DC line resistor is 0.13Ω.

The current of simulation device main circuit used for control calculation is acquired by a 2-3 A of sensor to ensure accuracy; and the current sensor range used for protection is 15 A.

Consider the DC line current of dynamic simulation system is positive and negative 1-4 A, and maximum over current is about 10 A, over voltage is 700V.

After calculation, when the valve side AC outlet voltage occurs serious opposite phase sequence fault, the transformer secondary maximum AC is 8 A.

MMC converter is set in a standard cabinet, cabinet size is 80 cm*80 cm*2260 cm, sub modules of one bridge arm are integrated in the same cabinet, main circuit is connected with the chassis backplane bus, multiple measuring points are extracted from the backplane bus, real-time monitoring the trigger pulse, source voltage, capacitance voltage of sub modules etc. Because the entire valve is in the relatively low potential, so the bridge arm sensor and module control circuit is in direct energy feeding mode used, using 1000V DC stabilized power supply.

According to actual level number and voltage balancing strategy, the parameters of negative impedance compensator string into the arm is adjusted to balance out part voltage drop of bridge arm semiconductors.

Sub module voltage is detected by electronic controller of sub module, and then code and send it to valve based electronics through an optical fiber.

Figure 3:
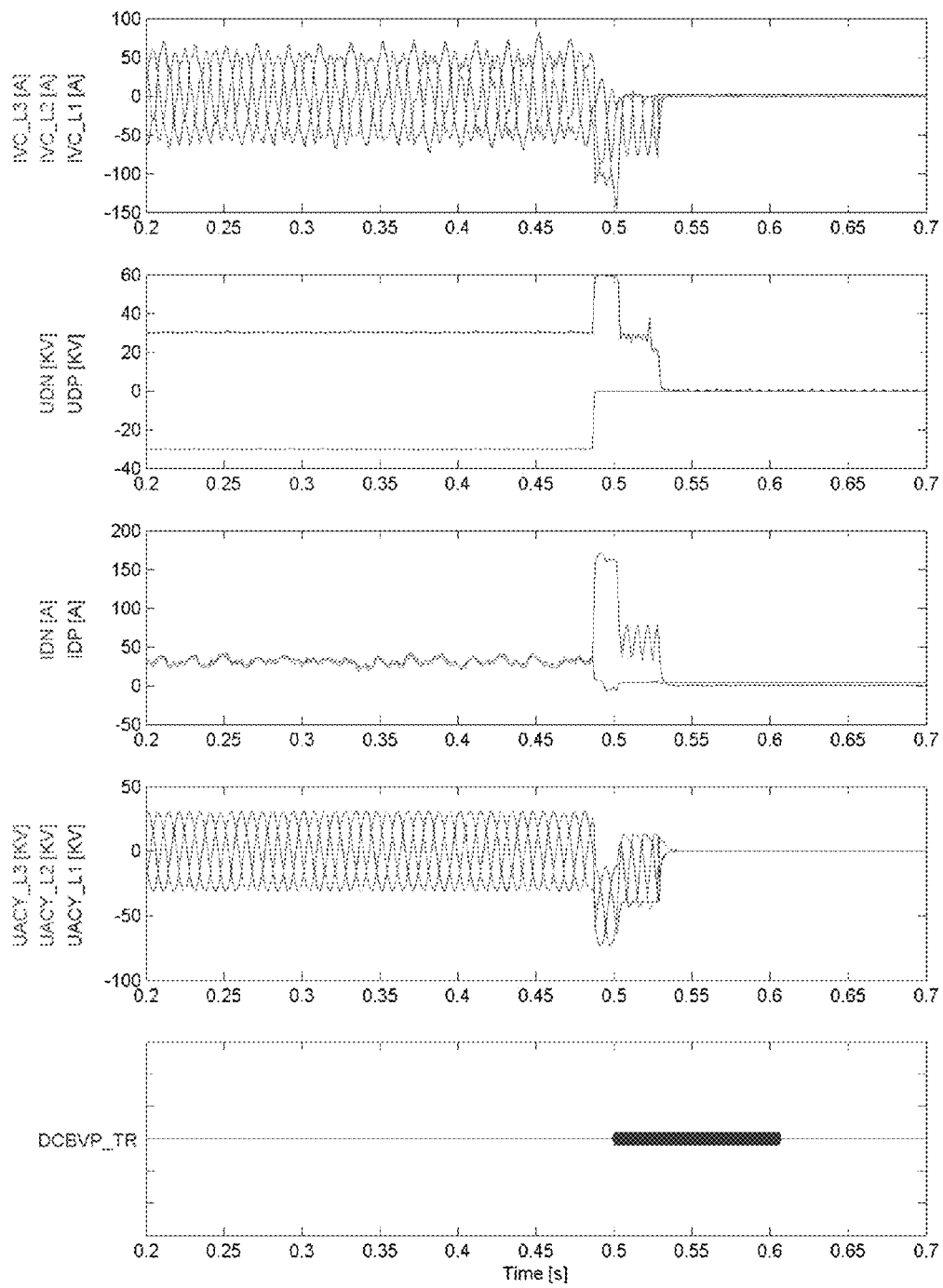
FIG. 3 is a fault waveform caused by monopolar grounding on DC line using the dynamic simulation test device provided by the invention.

FIG. 3 is the fault waveform caused by monopolar grounding on DC line using the dynamic simulation test device provided by the invention.

The first waveform is AC three phase current waveform of the converter, UDN/UDP are the voltage to earth of the DC negative and positive, IDN/IDP are DC negative and positive current, UACY is simulation converter AC outlet voltage AC, DCBVP_TR is simulation DC circuit breaker triggered waveform.

The DC voltage is set to equivalent 60 Kv during test as figure shown, DC cathode busbar monopolar grounding fault occurs at 0.48 s, UDN is changed to ground potential, UDP is up to the 60 kV, AC current shocks, IDN is seriously over current to leases the line capacitance energy to ground, and then DC overvoltage protection acts, and triggers DCB-VP_TR.

Considering the dynamic characteristics of the voltage and current with time increasing, the dynamic process of the simulation experimental device is complete similar to that of actual project.

Embodiment 2

The embodiment is same to embodiment 1 except below differences:

(1) The negative impedance compensator is stringed into MMC converter bridge arm to balance out part voltage drop of arm semiconductors. The compensation characteristics of the compensator are obtained directly by the arm current direction and the voltage balance control strategy.

(2) another voltage\current acquisition board is added between the contactor I and converter transformer primary side voltage\current acquisition board. The former acquisition board can control the voltage\current signal, while new added acquisition board can recode signal.

At last, in this description of the embodiments, we have detail describe the present invention according to a particular example. The detail embodiment is one example of the invention but not the only one, so the person in this field must be understood that all the alternatives and other equal and/or similar examples are all within the range of the invention and they are all consistent with the spirits of this invention, are all protected by our claims.

What is claimed is:

1. A real time dynamic physics simulation device of flexible DC transmission system is characterized that, it includes simulated converter transformer, simulated AC field, simulated DC field, simulated converter reactor, simulated converter, and measurement and control cabinet chassis;
    said simulated AC field includes a vacuum switch I, a contactor I, resistors and a vacuum switch II, and they are serially connected; said simulated DC field includes serially connected the vacuum switch contactor III and II; said simulated AC field is connected with said measurement and control cabinet chassis;
    said converter transformer is between said resistors and said vacuum switch II; and
    said simulated converter reactors and said simulated converter are connected that is between the vacuum switch II and the vacuum switch III.

2. The real time dynamic physics simulation device of flexible DC transmission system according to claim 1, is characterized that, said measurement chassis includes an analog acquisition board, a signal conditioning board, a switching quantity input and output plate, a central processing board, a display and a recording equipment; said analog acquisition board gathers corresponding analog and switch quantities; and it outputs control signals through a switching quantity output interface to realize a circuit breaker/closing operation of all levels breakers.

3. The real time dynamic physics simulation device of flexible DC transmission system according to claim 1, is characterized that, said control cabinet comprises central processing boards, optical fiber communication board cards, and a power board; said central processing board comprises DSP, FPGA processor, level conversion circuit and communication channels; said control cabinet is used for connecting test system, and its current and voltage signals will be send to upper layer control system through said communication channels.

4. The real time dynamic physics simulation device of flexible DC transmission system according to claim 1, is characterized that, said converter is three-phase full bridge form, of which each phase has upper and lower two arms, each bridge arm consists of several scaled down MMC sub module boards in series with each other.

5. The real time dynamic physics simulation device of flexible DC transmission system according to claim 1, is characterized that, said converter transformer is a three-phase YD tapped double windings transformer.

6. The real time dynamic physics simulation device of flexible DC transmission system according to claim 1, is characterized that, said converter reactor is a three-phase low loss and high quality factor dry-type reactor; of which each phase has two reactors with same reactance value.

7. The real time dynamic physics simulation device of flexible DC transmission system according to claim 1, is characterized that, a set contactor III is connected with said resistors in parallel.

8. The real time dynamic physics simulation device of flexible DC transmission system according to claim 1, is characterized that, said converter transformer is non standard transmission ratio transformer, according to the simulated system, a capacitance ratio and a transformer ratio are selected, and the equation is:

$$N_s = \frac{S_{prototype}}{S_{demonstration\ project}}$$

$$N_v = \frac{V_{prototype}}{V_{demonstration\ project}}.$$

9. The real time dynamic physics simulation device of flexible DC transmission system according to claim 1, is characterized that, said converter reactor is designed according to the actual engineering impedance ratio, is configured to limit the transient and fault current overshoot of simulated device, and its current and impedance simulation ratio are:

$$N_I = \frac{N_S}{N_V}$$

$$N_Z = \frac{N_V}{N_I}.$$

* * * * *